(12) United States Patent
Buccinna et al.

(10) Patent No.: US 6,722,916 B2
(45) Date of Patent: Apr. 20, 2004

(54) SURFACE BATTERY CLIP

(75) Inventors: Frank Buccinna, Livonia, MI (US); Michael Zaltz, Detroit, MI (US)

(73) Assignee: Siemens VDO Automotive Corporation, Auburn Hills, MI (US)

( * ) Notice: Subject to any disclaimer, the term of this patent is extended or adjusted under 35 U.S.C. 154(b) by 25 days.

(21) Appl. No.: 09/943,049

(22) Filed: Aug. 30, 2001

(65) Prior Publication Data

US 2002/0142648 A1 Oct. 3, 2002

Related U.S. Application Data

(60) Provisional application No. 60/280,022, filed on Mar. 30, 2001.

(51) Int. Cl.$^7$ .............................. H01R 3/00; H05K 1/00
(52) U.S. Cl. .......................................... 439/500; 439/73
(58) Field of Search ................................ 439/500, 504, 439/627, 73; 361/760, 761, 767, 768, 769

(56) References Cited

U.S. PATENT DOCUMENTS

| | | | |
|---|---|---|---|
| 3,625,837 A | * 12/1971 | Nelson et al. ............... | 205/125 |
| 4,653,822 A | 3/1987 | Kanazawa | |
| 4,998,888 A | * 3/1991 | Link et al. ..................... | 439/73 |
| 5,229,641 A | 7/1993 | Katayama | |
| 5,528,463 A | 6/1996 | McLellan et al. | |
| 5,558,679 A | 9/1996 | Tuttle | |
| 5,586,907 A | 12/1996 | Frantz et al. | |
| 5,805,423 A | 9/1998 | Wever et al. | |
| 5,931,693 A | 8/1999 | Yamazaki | |
| 5,980,309 A | 11/1999 | Frantz et al. | |
| 5,993,248 A | 11/1999 | Bethurum | |
| 6,039,601 A | 3/2000 | Kraiczyk et al. | |
| 6,077,106 A | 6/2000 | Mish | |
| 6,142,823 A | 11/2000 | Ishibashi | |
| 2001/0005123 A1 | * 6/2001 | Jones et al. .................. | 320/107 |

OTHER PUBLICATIONS

Photos 1 through 8, no date.

* cited by examiner

*Primary Examiner*—Chandrika Prasad

(57) ABSTRACT

An electronic component is provided that includes a printed circuit board having first and second battery contacts. A battery clip having a bottom portion is connected to the first battery contact. The battery clip also includes a top portion spaced from the printed circuit board with a tab extending from the top portion in a downward direction toward the printed circuit board. A coin cell battery is arranged between the battery clip and the second battery contact. The present invention battery clip biases the battery into engagement with the second battery contacts with the tab. The second battery contacts may be provided by a solder bump or a printed circuit preferably arranged in a criss-cross waffle shaped pattern. The battery clip is secured to the first battery contacts preferably by applying a solder paste that is heated to electrically join the battery clip to the first battery contacts.

22 Claims, 2 Drawing Sheets

SURFACE BATTERY CLIP

RELATED APPLICATIONS

This patent application claims priority to provisional patent application Ser. No. 60/280,022 filed Mar. 30, 2001.

BACKGROUND OF THE INVENTION

This invention relates to a battery clip, and more particularly, the invention relates to a battery clip for use with a printed circuit board.

Coin cell batteries are used in such devices as key fobs for vehicles. A battery clip is secured to a printed circuit board, and the coin cell battery is inserted into the battery clip. The battery clip may be secured to the printed circuit board by pins which are inserted into holes in the circuit board and soldered thereto, or alternatively, the battery clip may be secured to the printed circuit board by surface mounts or pads that are soldered to a surface on the printed circuit board. The battery clip typically provides the positive terminal, or anode. The battery clip has included a plurality of tabs perpendicular to a portion of the battery clip and parallel to the printed circuit board.

The negative terminal, or cathode, has been provided by a clip or spring-like device centrally located relative to the battery clip. The spring-like clip biases the coin cell battery into engagement with the battery clip to ensure that there is sufficient contact between the positive and negative terminals and the coin cell battery. The spring clip may cost around $0.07 per unit to produce and secure to the printed circuit board. Therefore, it is desirable to eliminate the spring clip to reduce the overall cost of the key fob. Therefore, what is needed is a battery clip and negative terminal that reduces the overall cost of the printed circuit board and key fob while providing sufficient contact between the positive and negative terminals and the coin cell battery.

SUMMARY OF THE INVENTION AND ADVANTAGES

The present invention provides an electronic component including a printed circuit board having first and second battery contacts. A battery clip having a bottom portion is connected to the first battery contact. The battery clip also includes a top portion spaced from the printed circuit board with a tab extending from the top portion in a downward direction toward the printed circuit board. A coin cell battery is arranged between the battery clip and the second battery contact. The present invention battery clip biases the battery into engagement with the second battery contacts with the tab. The second battery contacts may be provided by a solder bump or a printed circuit preferably arranged in a criss-cross waffle-shaped pattern. The battery clip is secured to the first battery contacts preferably by applying a solder paste that is heated to electrically join the battery clip to the first battery contacts.

Accordingly, the above invention provides a battery clip and negative terminal that reduces the overall cost of the printed circuit board and key fob while providing sufficient contact between the positive and negative terminals and the coin cell battery.

BRIEF DESCRIPTION OF THE DRAWINGS

Other advantages of the present invention can be understood by reference to the following detailed description when considered in connection with the accompanying drawings wherein.

DETAILED DESCRIPTION OF THE PREFERRED EMBODIMENT

Figure 1:
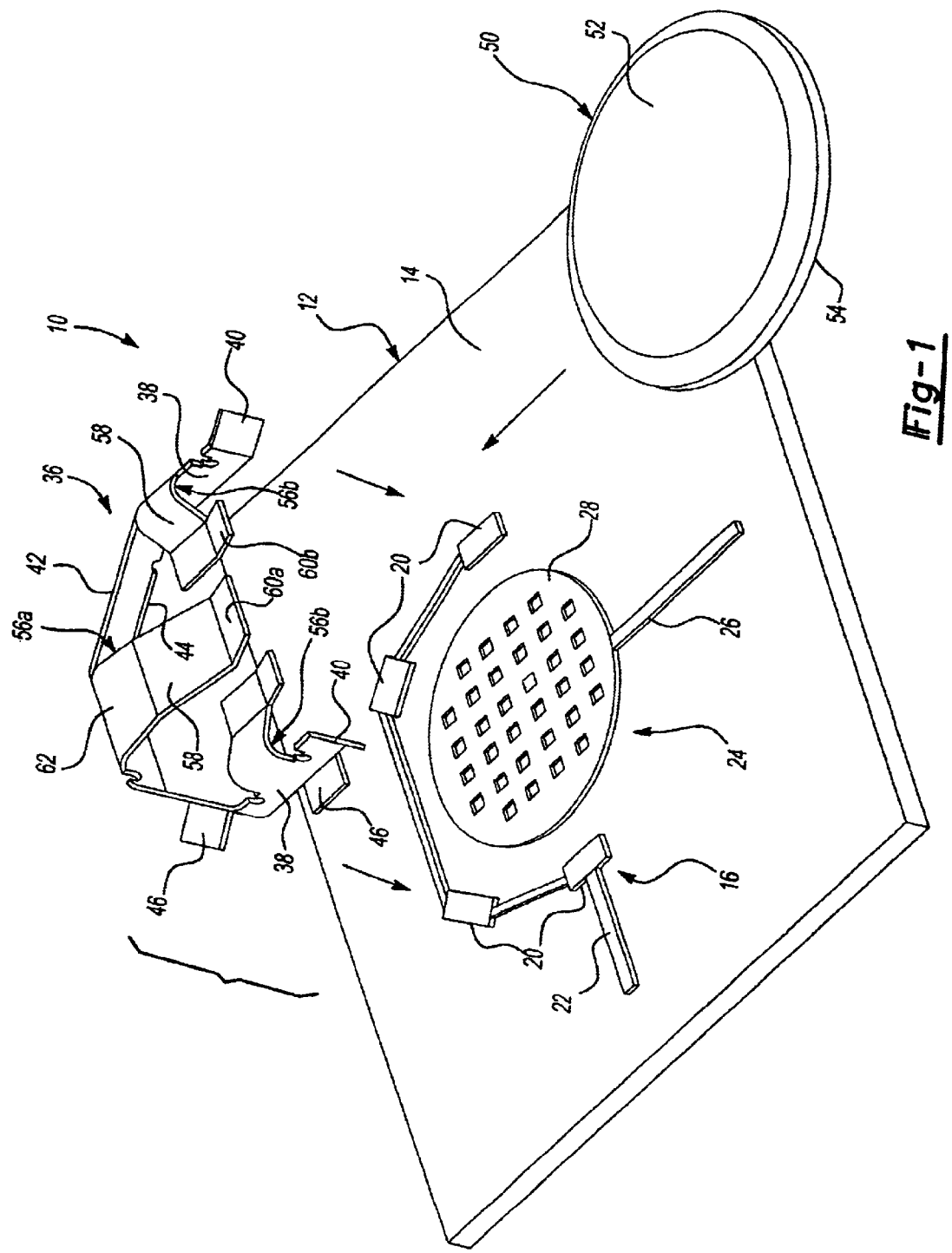
FIG. 1 is a perspective view of an electric component including the present invention battery clip.
Figure 2:
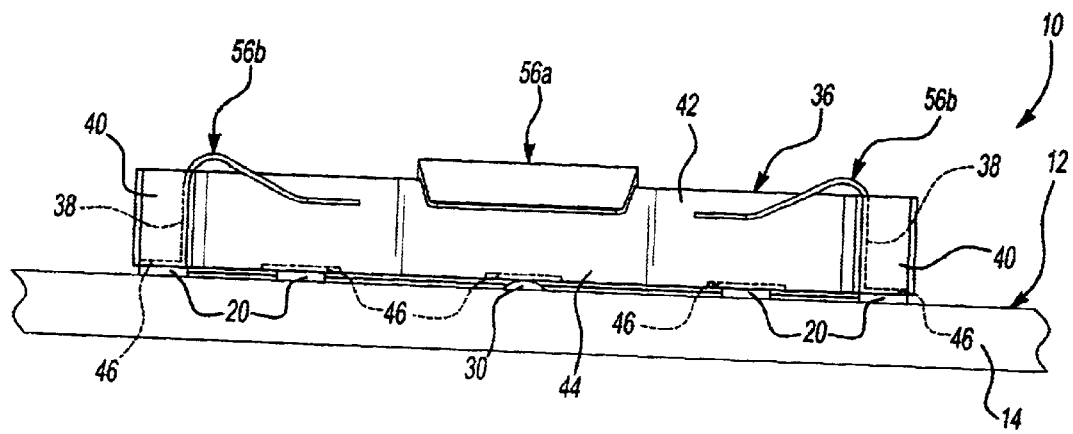
FIG. 2 is a front elevational view of the battery clip secured to the printed circuit board.

An electronic component 10 such as a key fob for a vehicle is shown in FIGS. 1 and 2. The electronic component 10 may include a printed circuit board 12 (PCB) including a substrate 14 and printed circuit material 16 deposited on the substrate surface in any manner known in the art. The printed circuit 16 may include first battery contacts 20 which provide the positive terminal, or anode, for a battery. The first battery contacts 20 may have traces connected thereto for providing the electrical connection from the battery to the other components on the PCB 12. Similarly, the printed circuit 16 may include a second battery contact 24 providing the negative terminal, or cathode, for the battery. The second battery contact 24 may include a trace 26 electrically connecting the battery to the other electrical components on the PCB 12. Although four first battery contacts 20 are shown, any suitable number may be used. Similarly, although one negative terminal 24 is shown, any number may be used.

A generally U-shaped battery clip 36 is secured to the PCB 12 and provides a housing into which a coin cell battery 50 may be inserted to provide power to the PCB 12. The battery clip 36 includes spaced apart legs 38 having end portions 40 angled away from one another, or flared outward, to facilitate insertion of the coin cell battery 50. The battery clip 36 includes top 42 and bottom 44 portions. A plurality of pads 46 extend generally perpendicularly from the bottom portion 44 and are secured to first battery contacts 20. The pads 46 are preferably surface mounted to the first battery contacts 20. Alternatively, the bottom portion 44 may include pins received into holes or apertures in the printed circuit 16, as is well known in the art.

The coin cell battery 50 includes an anode 52 or positive portion and a cathode 54 or negative portion. The coin cell battery 50 is inserted into the mouth of the U-shaped battery clip 36 such that the cathode 54 is adjacent to the second battery contact 24. The top portion 42 of the battery clip 36 includes at least one tab, preferably three, extending in a downward direction toward the PCB 12. The tab 56A includes a first portion 58 extending downwardly from the top portion 42 towards the PCB 12 and a second portion 60A adjoining the first portion 58 and extending upwardly away from the PCB 12 to facilitate insertion of the coin cell battery 50. The tab 56A may additionally include a flat portion 62 arranged between the first portion 58 and the top portion 42 for use in assembling the battery clip 36 to the PCB 12. Preferably, the flat portion 62 is generally parallel to the PCB 12, and a vacuum source manipulates the battery clip 36 by holding the battery clip by the flat portion 62. Opposing tabs 56B also include a first portion 58 extending downwardly from the top portion 42 and include a second portion 60B extending upwardly away from the PCB 12 to facilitate insertion of the coin cell battery 50.

Figure 3:
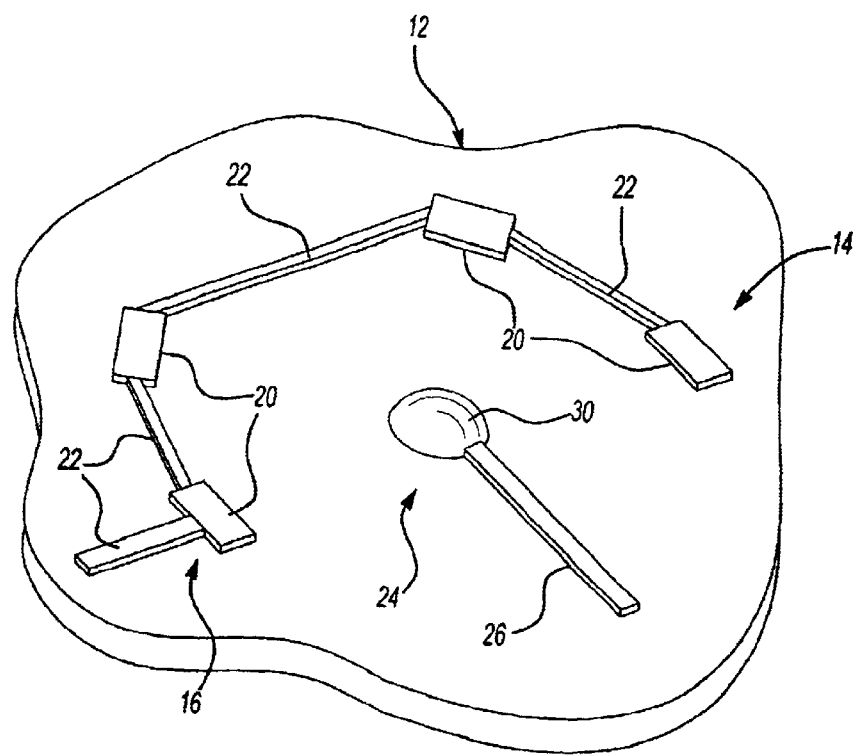
FIG. 3 is a perspective view of an alternative embodiment of the second battery contact.

The downwardly extending tabs 56A and 56B obviate the need for a spring-like negative battery contact as used in the prior art. The tabs 56A and 56B bias or urge the coin cell battery 50 into engagement with the second battery contact. The second battery contact 24 may be provided by a criss-cross waffle-shaped printed circuit 28, as shown in FIG. 1, or a solder bump 30, as shown in FIG. 3.

The invention has been described in an illustrative manner, and it is to be understood that the terminology that has been used is intended to be in the nature of words of description rather than of limitation. Obviously, many modifications and variations of the present invention are possible in light of the above teachings. It is, therefore, to be understood that within the scope of the appended claims the invention may be practiced otherwise than as specifically described.

What is claimed is:

1. An electronic component comprising:
   a printed circuit board including first and second battery contacts;
   a battery clip having a bottom pardon connected to said first battery contact, and a top portion spaced from said printed circuit board with a tab including a first portion extending from said top portion in a downward direction toward said printed circuit board, said tab including a second portion extending from said first portion upwardly away from said printed circuit board; and
   a coin cell battery arranged between said battery clip and said second battery contact with said tab biasing said battery into engagement with said second battery contact.

2. The electronic component according to claim 1, wherein said second battery contact is a solder bump.

3. The electronic component according to claim 1, wherein said second battery contact is a criss-cross printed circuit.

4. The electronic component according to claim 1, including a plurality of tabs extending radially from top portion in a downward direction toward said printed circuit board.

5. The electronic component according to claim 1, further including a plurality of first battery contacts wherein said bottom portion includes a plurality of pads extending therefrom soldered to said first battery contacts.

6. The electronic component according to claim 1, wherein said battery clip is generally U-shaped including spaced apart legs having end portions angled away from one another with said spaced apart legs engaging opposing sides of said battery.

7. The electronic component according to claim 6, wherein said battery clip is metallic and said end portions and said tab are iii electrical connection with one another.

8. The electronic component according to claim 1, wherein said tab includes a flat portion generally parallel with said printed circuit board extending between said top portion and said first portion with said flat portion adapted to be attached to a vacuum source during manipulation of said battery clip.

9. A battery clip comprising;
   a generally U-shaped portion defining top and bottom portions, said U-shaped portion including spaced apart legs defining an opening adapted to receive a coin cell battery; and
   a tab extending from said top portion toward said opening, said tab including a first portion extending in a downward direction toward said bottom portion and a second portion extending from said first portion upwardly away from said bottom portion.

10. The battery clip according to claim 9, wherein said tab includes a plurality of tabs extending radially from top portion in a downward direction toward said bottom portion.

11. The battery clip according to claim 9, wherein said bottom portion includes a plurality of pads extending generally perpendicular therefrom.

12. The battery clip according to claim 9, wherein said legs include end portions angled away from one another.

13. The battery clip according to claim 12, wherein said end portions and said at least one tab are in electrical connection with one another.

14. The battery clip according to claim 12, wherein said battery clip is metallic.

15. The battery clip according to claim 9, wherein said tab includes a flat portion generally perpendicular to said top portion extending between said top portion and said first portion with said flat portion adapted to be attached to a vacuum source during manipulation of said battery clip.

16. A method of attaching a battery to a printed circuit board comprising the steps of:
   a) providing a printed circuit board having first and second battery contacts;
   b) securing a battery clip to the first battery contacts;
   c) providing a tab extending downwardly from the battery clip toward the printed circuit board;
   d) inserting a coin cell into the battery clip subsequent to performing step b); and
   e) biasing the coin cell with the tab into engagement with the second battery contact.

17. The method according to claim 16, wherein step a) includes the second battery contact formed by a solder bump.

18. The method according to claim 16, wherein step a) includes the second battery contact formed by a crisscross printed circuit.

19. The method according to claim 16, wherein step b) includes applying a solder paste between a pad extending from said battery clip and the first battery contact.

20. The method according to claim 19, wherein the battery clip includes a plurality of pads extending therefrom.

21. The method according to claim 16, wherein step c) includes providing a plurality of tabs extending downwardly therefrom toward the printed circuit board.

22. The method according to claim 16, wherein step c) includes a first portion extending downwardly from the battery clip toward the printed circuit board and a second portion extending upwardly away from the printed circuit board facilitating the insertion of the coin cell into the battery clip.

* * * * *